(12) United States Patent
Ehrenreich et al.

(10) Patent No.: US 6,937,847 B2
(45) Date of Patent: Aug. 30, 2005

(54) INTEGRATED RF SIGNAL LEVEL DETECTOR USABLE FOR AUTOMATIC POWER LEVEL CONTROL

(75) Inventors: Sebastian Ehrenreich, Dresden (DE); Lutz Dathe, Dresden (DE); Karl-Heinz Sandig, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 448 days.

(21) Appl. No.: 10/327,162

(22) Filed: Dec. 20, 2002

(65) Prior Publication Data

US 2004/0198262 A1 Oct. 7, 2004

(30) Foreign Application Priority Data

Oct. 30, 2002 (DE) .......................... 102 50 613

(51) Int. Cl.[7] ................................. H04B 1/38
(52) U.S. Cl. ...................... 455/115; 455/126; 455/127; 455/69; 455/522; 324/110
(58) Field of Search ................. 455/127, 126, 455/522, 324; 324/120

(56) References Cited

U.S. PATENT DOCUMENTS

| | | | |
|---|---|---|---|
| 4,982,427 A | | 1/1991 | Nicolai |
| 5,396,538 A | * | 3/1995 | Hong .......................... 455/573 |
| 5,566,363 A | * | 10/1996 | Senda ......................... 455/126 |
| 5,631,930 A | * | 5/1997 | Sasaki ......................... 375/296 |
| 5,722,057 A | * | 2/1998 | Wu .......................... 455/127.1 |
| 5,832,022 A | * | 11/1998 | Scott .......................... 375/142 |
| 5,886,657 A | * | 3/1999 | Ahuja .......................... 341/144 |
| 6,038,432 A | * | 3/2000 | Onoda ...................... 455/127.2 |
| 6,097,615 A | * | 8/2000 | Dent ............................ 363/43 |
| 6,442,380 B1 | * | 8/2002 | Mohindra ................ 455/234.1 |
| 6,560,448 B1 | * | 5/2003 | Baldwin et al. ......... 455/234.1 |
| 6,727,754 B2 | * | 4/2004 | Dupuis et al. .............. 330/254 |
| 6,871,055 B2 | * | 3/2005 | Hirano et al. ................ 455/310 |
| 2003/0227964 A1 | * | 12/2003 | Honkanen et al. .......... 375/216 |

FOREIGN PATENT DOCUMENTS

| | | |
|---|---|---|
| DE | 3640969 | 11/1986 |
| DE | 69218314 | 7/1992 |
| GB | 2 313 967 A | 12/1997 |

OTHER PUBLICATIONS

Patent Abstracts of Japan, vol. 1999, No. 10, Aug. 31, 1999, and JP 11 136057 A dated May 21, 1999.

Alexandre Vouilloz et al. "A Low–Power CMOS Super–Regenerative Receiver at 1 GHz", IEEE Journal of Solid–State Circuits, vol. 36, No. 3, Mar. 2001, pp. 440–451.

SU D.K. et al. "IC for Linearizing RF Power Amplifiers Using Envelope Elimination and Restoration", IEEE Journal of Solid–State Circuits, vol. 33, No. 12, Dec. 1998, pp. 2252–2258.

International Search Report, Application No. PCT/US 03/34856, mailed Jul. 5, 2004.

* cited by examiner

*Primary Examiner*—Quochien B. Vuong
*Assistant Examiner*—Christian Hanon
(74) *Attorney, Agent, or Firm*—Meyertons Hood Kivlin Kowert & Goetzel, P.C.; B. Noël Kivlin

(57) ABSTRACT

A radio frequency signal level is determined by generating an AC reference voltage from a DC reference voltage and determining an envelope of the AC reference voltage in an envelope detector having substantially the same composition as an envelope detector for determining the envelope of the radio frequency signal. The AC reference voltage substantially eliminates any DC offset and thus induces a high immunity against temperature and power supply variations. Moreover, using substantially the same RF signal path for the RF signal and the reference signal, signal distortions cause by the RF signal path are substantially compensated for.

26 Claims, 3 Drawing Sheets

INTEGRATED RF SIGNAL LEVEL DETECTOR USABLE FOR AUTOMATIC POWER LEVEL CONTROL

FIELD OF THE PRESENT INVENTION

The present invention generally relates to automated methods for determining a radio frequency (RF) signal emitted by a transmitter device, such as used in wireless communication systems including, for example, wireless local area networks (WLAN), mobile 'phones, and the like, and more particularly relates to an on-chip detection system for RF signals that may readily be implemented into an integrated automatic power level control system.

DESCRIPTION OF THE PRIOR ART

Due to the ever increasing demand for two-way wireless communication systems currently great efforts are being made to develop transmitter/receiver devices, and the following referred to as transceiver, offering a high degree of reliability at low cost. A key issue in this respect is the degree of integration with which a corresponding transceiver device may be manufactured. Additionally, in many applications such as mobile 'phones, mobile computer applications, and the like, low power consumption is of primary concern to obtain a long operational time with a limited battery power.

Presently, a huge number of transceiver devices is available, wherein substantially two major architectures of the transceiver devices are presently competing on the market. Due to the high degree of integration possible and the potential for reduction of power consumption, the so-called direct conversion architecture seems to become the preferred topography compared with the so-called super-heterodyne architecture. The super-heterodyne technique employs an intermediate frequency (IF) that is substantially lower than the frequency of the RF carrier wave. Although the super-heterodyne architecture is well-established and allows the fabrication of reliably operating devices, the highly selective RF filters necessary for the proper operation of these devices require the employment of capacitors and inductors of high quality, thereby restricting the degree of integration achievable, since high quality inductors may not be easily implemented into a semiconductor substrate. This fact and an inherently higher power consumption of amplifiers operating at higher frequencies caused the reintroduction of the very old so-called direct conversion technique, in which the small signal band, also referred to as base band, is directly up-converted into the RF frequency band during transmission and is directly down-converted to the base band upon receiving the RF carrier signal. Since signal processing substantially takes place in the base band, bulky high quality inductors may substantially be avoided and corresponding filter elements may be provided as on-chip implementations.

Irrespective of the architecture used in transceiver devices, there is generally a need for precisely controlling the operation of these devices so as to accomplish a reliable data communication under various environmental conditions. One issue in this respect is the control of the signal level output by the transmitter section of the transceiver device. Output power control is desirable for instance in applications wherein a maximum operational time is required with a limited supply power. In other applications, statutory regulations may dictate not to exceed a maximum output power, whereas in still other applications a continuous control of the output power depending on the device's location may be desirable in view of reducing interference with other transceiver devices.

A further issue concerns gain control at the receiver side, since extremely different input signal levels may be received caused by signal fluctuations owing to, for example, changes of location of the transmitter and/or the receiver. Therefore, to provide for a controlled transmit power and/or for a controlled receiver gain, the RF signal is to be detected and to be further processed so as to obtain an appropriate control variable that allows the adjustment of the output power to a desired magnitude or that may be used to otherwise control the operation of the transceiver device. For detecting the RF signal level, frequently so-called envelope detectors are used that allow to obtain a signal indicative of the strength of variation of the RF signal and thus of the RF output power level.

In IEEE Journal of Solid State Circuits, Vol. 36, No. 3, March 2001, "A low power CMOS super regenerative receiver at 1 GHz", by Alexandre Vouilloz et al, a low power and low voltage super regenerative receiver is disclosed, that operates at 1 GHz and is implemented in a 0.35 micrometer CMOS process. Among others, this receiver device includes a low noise amplifier, an oscillator and an envelope detector. The envelope detector is comprised of a transistor pair coupled at their drain and source terminals with a constant current source connected to the common source of the transistor pair. A reference voltage for an output voltage obtained at the common source of the transistor pair is generated by a transistor made of two parallel transistors with the same bias condition as the transistor pair, wherein a constant current source is provided at the source of the reference voltage transistor.

In IEEE Journal of Solid State Circuits, Vol. 33, No. 12, December 1998, "An IC for linearizing RF power amplifiers using envelope elimination and restoration" by David K Su and William J McFarland, a circuit for linearizing a transmitter output amplifier is disclosed. The integrated CMOS envelope detector includes an NMOS transistor with a constant current source in the source line and an integration capacitor parallel to the constant current source. Moreover, a pseudoreplica circuit is provided to cancel the DC voltage and reduce distortion of the first transistor, wherein the inputs of an operational amplifier are coupled to the source of the first transistor and that of the pseudoreplica circuit, respectively. The output of the operational amplifier is fed back to the gates of the transistor in that pseudoreplica circuit so that the output nodes of both transistors are maintained at an identical level.

In order to provide a precise and reliable control, for example of the transmit output power of a transceiver device, it is additionally necessary to compare the signal obtained by the envelope detector with an appropriately selected reference signal so as to obtain a control signal, wherein, however, not only detector internal variations but also variations in generating and processing the reference signal may lead to an instability of the corresponding control loop. In particular the influences of chip temperature, power supply fluctuations and variations of the manufacturing process may significantly degrade the capability of on-chip detection of absolute RF signal power levels and the comparison thereof with predefined reference signals.

In view of the above problems a need exists for an improved circuit for analyzing an RF signal level that eliminates or at least substantially reduces one or more of the problems identified above.

SUMMARY OF THE INVENTION

Generally, the present invention is directed at an RF signal level analyzing circuit that is advantageously usable in output power control of transceiver devices, wherein an improved stability is achieved in that one or more DC reference voltages are converted into a corresponding AC reference signal having a frequency comparable with the RF of the signal to be analyzed. The AC converted reference signal may then be processed similarly to the RF signal so as to minimize any variations that may be introduced by the RF signal path.

According to one illustrative embodiment an integrated RF signal level analyzing circuit comprises a reference voltage source that is configured to provide at least one reference voltage. A direct current/alternating current (DC/AC) converter is provided and is configured to receive the at least one reference voltage and to produce an AC reference voltage. Moreover, an envelope detector is configured to receive the AC reference voltage and an RF signal to be analyzed, and is further configured to generate a reference envelope signal and an RF envelope signal, respectively, from the signals supplied. The circuit further comprises a comparator circuit configured to receive the RF envelope signal and the reference envelope signal and to produce a comparator output signal indicative of a comparison result.

In a further illustrative embodiment, an integrated RF signal level analyzing circuit comprises a reference voltage source configured to provide a first reference voltage and a second reference voltage. A single channel DC/AC converter is provided and is configured to selectively receive the first and the second reference voltages. The single channel DC/AC converter is furthermore configured to output an AC reference voltage which is indicative of a voltage received. Moreover, a comparator circuit is provided and is configured to receive the RF signal and the AC reference voltage and is further configured to output a control signal indicative of a comparison result of the RF signal with a first AC reference voltage and a second AC reference voltage.

According to still a further illustrative embodiment, a transceiver device comprises a transmit circuit including an RF output stage and a control unit configured to adjust an output power level of the output stage. The transceiver further comprises an RF signal level analyzing circuit configured as described in the illustrative embodiments above, wherein the control unit adjusts the output power level on the basis of a control signal provided by the RF signal level analyzing circuit.

In still a further embodiment, a transceiver comprises an input stage configured to receive an RF signal. Moreover, an RF signal level analyzing circuit is provided and may comprise the components as described in the above illustrated embodiments.

In still a further illustrative embodiment, a method of determining an RF signal level comprises providing a first reference voltage and a second reference voltage and selectively converting the first and the second reference voltages into a first AC reference voltage and a second reference voltage, respectively, using the same signal processing path. Finally, the RF signal is compared with the first and the second AC reference voltages to obtain a control signal indicative of a result of the comparison.

In a another illustrative embodiment, a method of detecting a radio frequency signal level comprises providing at least one DC reference voltage and converting the at least one DC reference voltage into an AC reference voltage. An envelope of the radio frequency signal and of the AC reference voltage is measured and the envelope of the radio frequency signal is compared with the envelope of the AC reference voltage to produce a control output signal indicative of a result of the comparison.

BRIEF DESCRIPTION OF THE DRAWINGS

Further advantages, objects and embodiments of the present invention are defined in the appended claims and will become more apparent with the following detailed description when taken with reference to the accompanying drawings, in which:

DETAILED DESCRIPTION

Figure 1:
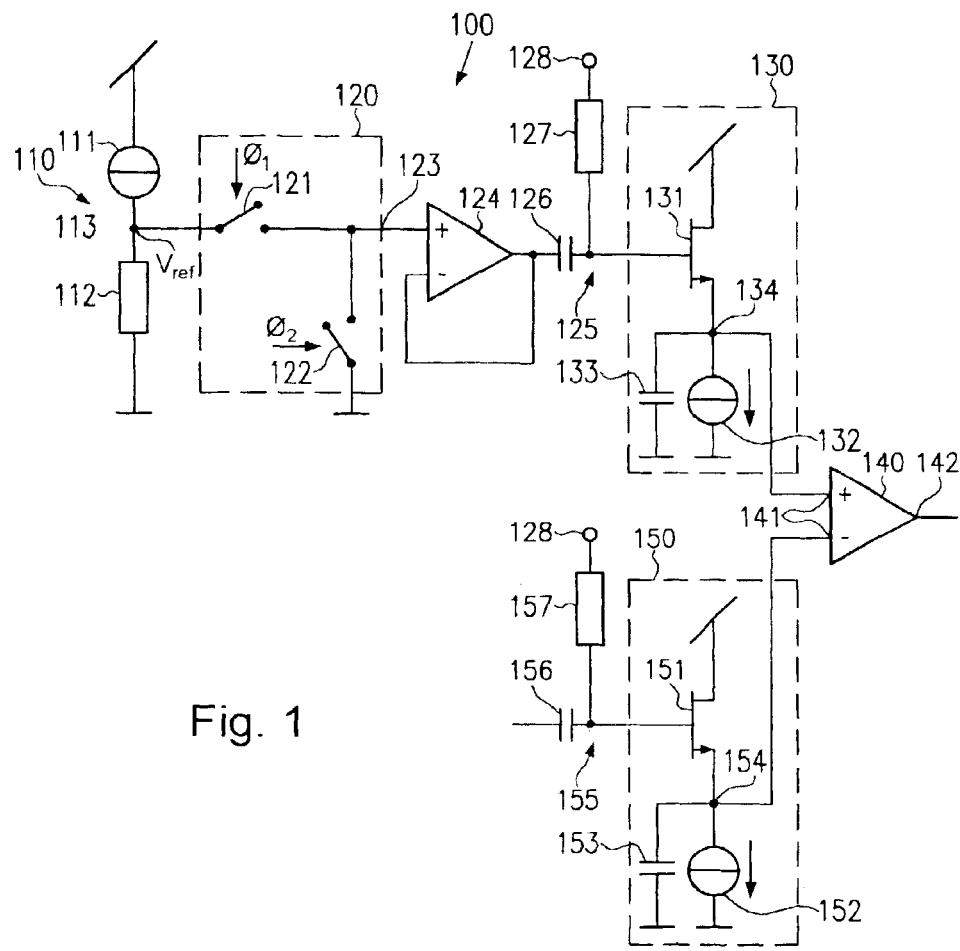
FIG. 1 is a schematic circuit diagram illustrating one illustrative embodiment of an RF signal analyzing circuit.

While the present invention is described with reference to the embodiments as illustrated in the following detailed description as well as in the drawings, it should be understood that the following detailed description as well as the drawings are not intended to limit the present invention to the particular illustrative embodiments disclosed, but rather the described illustrative embodiments merely exemplify the various aspects of the present invention, the scope of which is defined by the appended claims.

FIG. 1 shows a circuit diagram referring to a first illustrative embodiment of an RF signal level analyzing circuit 100, in which an RF signal level is compared to an AC reference voltage. The circuit 100 comprises a DC reference voltage source 110 configured to generate a DC reference voltage $V_{ref}$. In the illustrative embodiment of FIG. 1, the reference voltage source 110 may comprise a constant current source 111 and a resistor 112 connected in series, wherein the reference voltage $V_{ref}$ is available on a node 113. The reference voltage source 110 is connected to a DC/AC converter 120 which, in the present example, may comprise a first switch 121 and a second switch 122, wherein the first switch 121 is connected to receive at a first terminal the reference voltage $V_{ref}$ and is connected with a second terminal to an output 123 of the DC/AC converter 120. The second switch 122 is connected with one terminal to a second reference voltage, in the present example indicated as ground potential, and the other terminal is connected to the output 123. Moreover, the switches 121 and 122 include respective control input terminals to receive a clock signal Ø1 and Ø2, respectively, that allow to control the operation of the switches 121 and 122.

The circuit 100 further comprises an envelope detector 130 that is coupled to the DC/AC converter 120 via a signal buffer 124 and a high pass element 125 comprised of a capacitor 126 and a resistor 127 that is coupled to a specified reference potential 128. The high pass element 125 provides for AC coupling between the DC/AC converter 120 and the envelope detector 130 and also provides a DC bias for the envelope detector 130. The envelope detector 130 may comprise any appropriate architecture that allows to detect the level of an AC signal supplied thereto.

In one embodiment, as shown in FIG. 1, the envelope detector 130 comprises a transistor 131 the gate of which is connected to the capacitor 126 and the resistor 127. The source of the transistor 131 is connected to a constant current source 132, wherein an integrating capacitor 133 is connected in parallel to the constant current source 132. The source of the transistor 131, the capacitor 133 and the constant current source 132 are connected at a common node 134, which also serves as an output of the envelope detector 130. The output 134 is connected to an input 141 of a comparator circuit 140 having an output 142 for providing a control signal indicating a comparison result.

In addition, the circuit 100 may further comprise a second envelope detector 150 that is preferably of similar arrangement as the first envelope detector 130. Thus, the second envelope detector 150 may include a transistor 151 the source of which is connected to a capacitor 153 and a constant current source 152, wherein a common node of the transistor source the capacitor 153 and of the current source 152 represents an output 154 of the second envelope detector 150. A high pass element 155 may be provided including a capacitor 156 and a resistor 157 one end of which is coupled to the reference potential 128. As explained with reference to the first envelope detector 130 the high pass element 155 provides for AC coupling to the second envelope detector 150 and also supplies a DC bias to the transistor 151. It should be noted that the first and second envelope detectors 130, 150 may be manufactured in a quite similar fashion, as these devices are formed in close proximity at a small chip portion so that manufacturing tolerances may be minimal.

In operation, the constant voltage source 110 provides the reference voltage $V_{ref}$ by impressing a constant current into the resistor 112. The switches 121, 122 may be operated by an appropriate clock signal, for example two non-overlapping out of phase clock signals Ø1 and Ø2 may be provided so as to obtain a substantial square wave signal at the output 123 having a frequency determined by the clock frequency of Ø1 and Ø2. In one embodiment, the frequency of the clock signals Ø1 and Ø2 is selected to substantially correspond to an RF signal to be analyzed.

The AC reference voltage obtained at the output 123 is coupled to the first envelope detector 130 via the buffer 124 and the capacitor 126. The AC reference voltage is then converted into a DC-based signal by the transistor 131, connected as a source follower, and the integration capacitor 133. Thus, a reference voltage is supplied to the comparator circuit 140 that has "experienced" an RF signal path substantially identical to the signal path of the RF signal to be analysed, which is provided to the second envelope detector 150. In particular, any offset of the DC reference voltage $V_{ref}$ is cancelled by converting the DC reference voltage into an AC-based reference voltage. Moreover, by using an RF signal path substantially identical to the signal path of the RF signal, any inherent variations thereof may be eliminated or at least significantly be reduced. Accordingly, any influence of temperature, power supply and process variations may be avoided or at least be reduced.

The comparator circuit 140 then generates an output signal indicative of a difference between the detected RF signal and the detected AC-based reference voltage. For instance, the comparator circuit 140 may be an offset compensated comparator using switched capacitor techniques as are well known in the art. For example, the AC-based reference voltage may indicate an upper permissible level of the RF signal level to be analyzed and the comparator circuit 140 may indicate an RF signal level too high when the envelope of the RF signal exceeds the envelope of the AC reference voltage. Although a single comparator may be advantageous in view of reducing required chip area by minimizing the number of components, in other applications the comparator circuit 140 may be configured to output a control signal at the output 142 that allows a more precise evaluation of the RF signal level. The control signal may then be used for further control purposes as will be described with reference to FIGS. 3–5, wherein the AC reference voltage allows the efficient reduction of offset induced variations.

Figure 2:
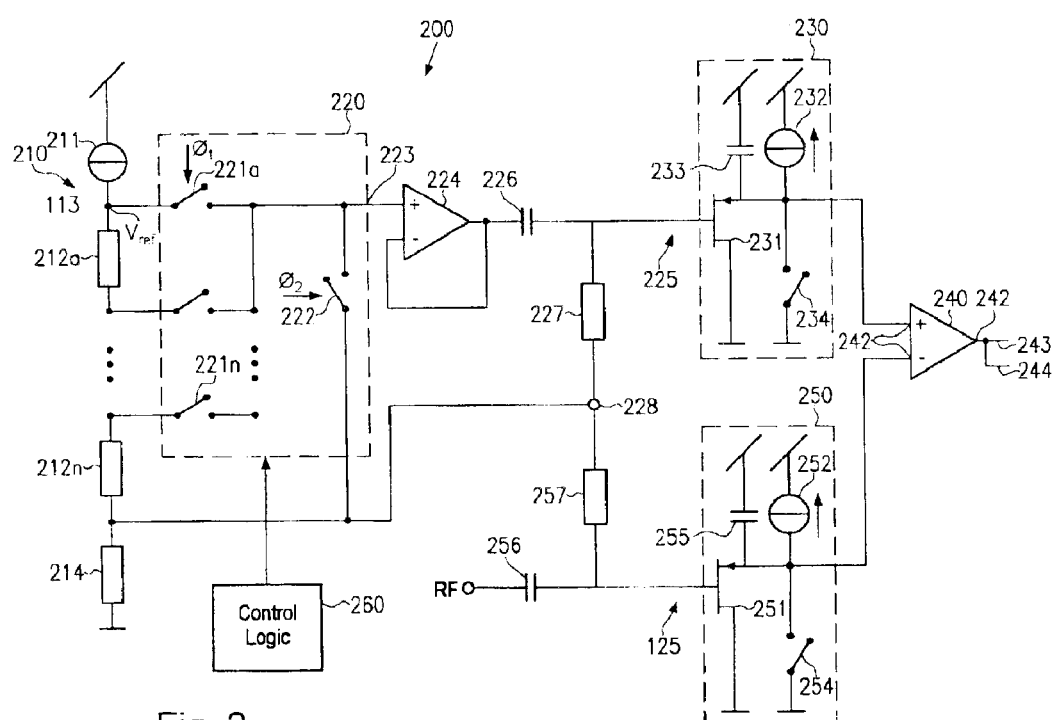
FIG. 2 is a circuit diagram schematically depicting illustrative embodiments, in which a plurality of reference voltages is used in analyzing an RF signal level.

FIG. 2 shows a circuit diagram in accordance with further illustrative embodiments. In FIG. 2 components and parts that are similar or identical to those shown in FIG. 1 are denoted by the same reference numerals except for a leading "2" instead of a leading "1". A description of these identical parts and components is therefore omitted. An RF signal level analyzing circuit 200 comprises a reference voltage source 210, a DC/AC converter 220, a first envelope detector 230 connected to the DC/AC converter 220 by a signal buffer 224 and a high pass element 225. Moreover, a second envelope detector 250 is provided and is preceded by a high pass element 255 for AC coupling an RF signal to be analysed. A comparator circuit 240 is connected to outputs of the first and second envelope detectors 230, 250.

The reference voltage source 210 may be configured to provide a plurality of DC reference voltages. In one embodiment, the reference voltage source 210 comprises a voltage divider including at least one first resistor 212a and a second resistor 214, wherein a voltage drop across the second resistor 214 provides the reference potential 228 coupled to the high pass elements 225 and 255. In the embodiment shown in FIG. 2, a third resistor 212n is provided that allows to obtain two different DC reference voltages, which in turn are different from the reference potential 228. In other embodiments, a plurality of first resistors 212a may be provided so as to obtain a plurality of different reference voltage pairs with respect to the reference potential 228. For example, the plurality of first resistors 212a may represent a plurality of target RF signal level ranges defined by the voltage drop across a respective one of the first transistors 212a, so that each respective reference voltage pair associated with each of the first resistors 212a may represent a maximum level and a minimum level, respectively. Thereby, any offsets of the supply voltage may lead to a variation of the absolute values of the reference voltages, but will substantially maintain the relative value, i.e. the histeresis of a corresponding reference voltage pair.

Each of the first resistors 212a and the third resistor 212n are connected to a corresponding plurality of first switches 221a–221n, wherein each of the first switches 221a–221n is connected to a control logic 260 that is configured to enable one of the first switches 221a while disabling the remaining first switches 221a–221n. For example, if only the first resistor 212a, the third resistor 212n and the resistor 214 are provided to form a voltage divider, a first reference voltage may be provided to the DC/AC converter 220 by enabling the first switch 221a and disabling the first switch 221n, and a second reference voltage may be applied by disabling the first switch 221a and enabling the first switch 221n. In the following, it is referred to a first and a second reference voltage that may represent an upper limit and a lower limit for a target signal level range determined by a respective first resistor 212a, wherein in other embodiments a plurality of reference voltages may be employed, for instance by selecting one of the switches 221a–221n, so that an RF signal level may be evaluated on the basis of a plurality of reference voltages.

The first and the second envelope detectors 230, 250 may further comprise switches 234, 254, respectively, connected to selectively reset the state of the first and second envelope detectors 230, 250. The switches 234, 254 may be connected to a control circuit (not shown) that allows the control of the switch operation. Moreover, contrary to the embodiments described with reference to FIG. 1, the transistors 231, 251 are P-channel MOS transistors, wherein it is noted that the selection of the type of MOS transistor to be used is a matter of design and process and N-channel MOS transistors may be selected if appropriate.

In operation, the control logic 260 may enable the first switch 221a so that operation of the switch 221a is controlled by a first clock signal Ø1, whereas the operation of the second switch 222 is controlled by the non-overlapping out of phase clock signal Ø2 to provide an AC reference voltage at the output 223. The further signal processing of the AC reference voltage is similar to that already described with reference to FIG. 1. Thus, the comparator circuit 240 receives a first AC-based reference voltage provided by the first envelope detector 230 and receives a signal indicative of the RF signal to be analyzed supplied to the second envelope detector 250. The comparator circuit 240 may then create a first control signal representing the result of the comparison. For example, the first control signal may be provided on a first signal line 243 in the form of a binary signal indicating whether the input signal of the second envelope detector 250 is higher or lower than the signal provided by the first envelope detector 230, thereby indicating whether the RF signal level exceeds a predefined upper limit, represented by the first AC-based reference voltage, or not.

The control logic 260 may then, for example based on the value of the first control signal or on a regular basis, disable the switch 221a and enable the switch 221n. At the same time, the switches 234, 254 may be activated for a predefined time interval so as to reset the first and second envelope detectors 230, 250. A corresponding control signal for activating the switches 234, 254 may for example be provided by the control logic 260. Next, the first and second switches 221n, 222 of the DC/AC converter 220 are operated in synchronism with the first and second clock signals Ø1, Ø2 to provide a second AC-based reference voltage to the comparator circuit 240, which is then compared to the current value of the RF signal level provided by the second envelope detector 250. The-comparator circuit 240 may then generate a second control signal provided on a second signal line 244 that represents the comparison result.

Similarly, in one embodiment, as explained above with reference to the first control signal, the second control signal may represent a digital signal indicating whether or not the signal level of the RF signal is lower than the lower limit represented by the second DC reference voltage. Thus, by providing only two control signal lines, such as lines 243, 244 the RF signal level may be assessed to be within a specified acceptable range or to exceed an upper limit or to be lower than a lower limit, so that by using these control signals an appropriate control action may be carried out. As is readily appreciable, the acceptable range or the RF signal level may be defined by selecting the magnitude of the resistors 212a and/or by the number of resistors 212a that are selected by the corresponding switches 212a. For example, if it is deemed appropriate to enlarge the allowable range of signal level variations, two resistors 212a may be used by appropriately selecting the corresponding switches 212a so as to obtain a greater difference between the first and the second DC reference voltage. Moreover, a plurality of measurement cycles may be carried out with different DC reference voltages applied to the DC/AC converter 220, wherein the comparator circuit 240 is configured to present a corresponding number of control signals each of which represents the corresponding comparison result.

As already pointed out with reference to FIG. 1, the embodiments described with reference to FIG. 2 allow to determine the RF signal level, wherein any DC offsets at the DC voltage side of the circuit 200 are substantially eliminated, since the difference of the first DC reference voltage and the second DC reference voltage is substantially maintained even if temperature and power supply induced variations occur. Moreover, processing the AC reference voltages in substantially identical signal paths, such as the first and the second envelope detectors allows to compensate for variations in the RF signal path. In one embodiment (not shown) a single envelope detector and a corresponding switch stage may be provided to selectively measure the AC reference voltage and the RF signal, wherein a sample-and-hold circuit at the output may temporarily hold the output signal that is then fed to the comparator circuit 240.

Figure 3:
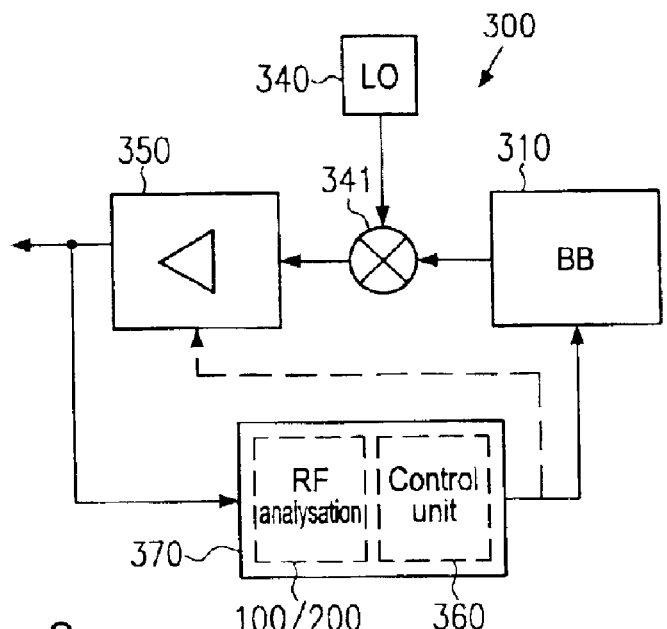
FIG. 3 is block diagram schematically illustrating a portion of a transceiver device including a control loop for adjusting an output power level, wherein the control loop includes an RF signal level analyzing circuit as for example described with reference to FIGS. 1 and 2.

FIG. 3 shows a block diagram schematically illustrating a transmitter section 300 of a transceiver device, such as used in WLAN applications. The transmitter section 300 comprises a base band circuit 310, a mixer 341, a local oscillator 340 and an output stage 350. Moreover, an automatic power level control circuit (APLC) 360 is provided that may include an RF signal level analyzing circuit, such as the circuits 100 or 200 described with reference to FIGS. 1 and 2. Moreover, the APLC circuit 360 comprises a control unit coupled to the analyzing circuit 100/200.

During operation, the base band circuit 310 receives a signal to be transmitted and appropriately processes the signal to obtain a suitable base band signal supplied to the mixer 341. The base band circuit 310 may comprise any appropriate means for processing a digital or analog input signal in accordance with the desired modulation scheme and transmitter architecture. For example, in a direct conversion architecture, the base band circuit 310 may comprise corresponding means for providing an in-phase and a quadrature base band signal that are then appropriately filtered. If a digital signal is input to the base band circuit 310, a corresponding digital to analog converter may be provided to obtain the required I and Q base band output signals. If a different architecture is used, the base band circuit 310 may include any intermediate frequency stages required to generate a signal appropriate for being modulated at the mixer 341.

The base band signal or base band signals are then provided to the mixer 341 so as to be mixed with the radio frequency signal provided by the local oscillator 340 to generate a modulated RF signal, which is then provided to the output stage 350. The modulated RF signal is amplified and output, wherein the signal is simultaneously provided to the APLC circuit 360, wherein the RF signal level analyzing circuit 100/200 provides one or more corresponding control signals to the control unit 361, which in turn supplies a corresponding gain control signal to the base band circuit 310 and/or to the output stage 350 to thereby adjust the output level to a predefined value or value range.

In many applications, the transmitter section 300 may be operated in a time-discrete manner, i.e. the signal transmission is carried out in the form of transmit cycles having a well defined duration, so that the operation of the APLC circuit 360 may be synchronized with the transmit cycles. For example, a first transmit cycle may be used to determine a comparison result with a first reference voltage and second reference voltage, and prior to a second transmit cycle the RF signal level may be readjusted. In other embodiments, the RF signal level may be compared to a plurality of reference voltages during a first transmit cycle and a corresponding control of the signal level may be carried out prior to a subsequent transmit cycle. Measuring the signal level during one or more transmit cycles and carrying out the gain control operation after completion of the transmit cycle or cycles and prior to a subsequent transmit cycle improves stability of the control loop, in particular when step-like changes are carried out in the gain control, since signal distortions during a step-like control change are avoided. In other embodiments when relatively long transmit times are used or when a quasi continuous transmit mode may occur, an appropriate "sample" rate for measuring the RF signal level may be selected, for example by appropriately operating the switches 234, 254 shown in FIG. 2, to obtain a quasi-continuous control effect.

Due to the high degree of immunity against temperature, power supply and process induced variations of the RF level analyzing circuit 100/200 in the APLC 360 the transmitter section 300 may readily be implemented as a single chip solution, since especially DC and temperature variations occurring in power consuming circuit sections, such as the output stage 350 may not unduly compromise the accuracy of the APLC circuit 360.

Figure 4:
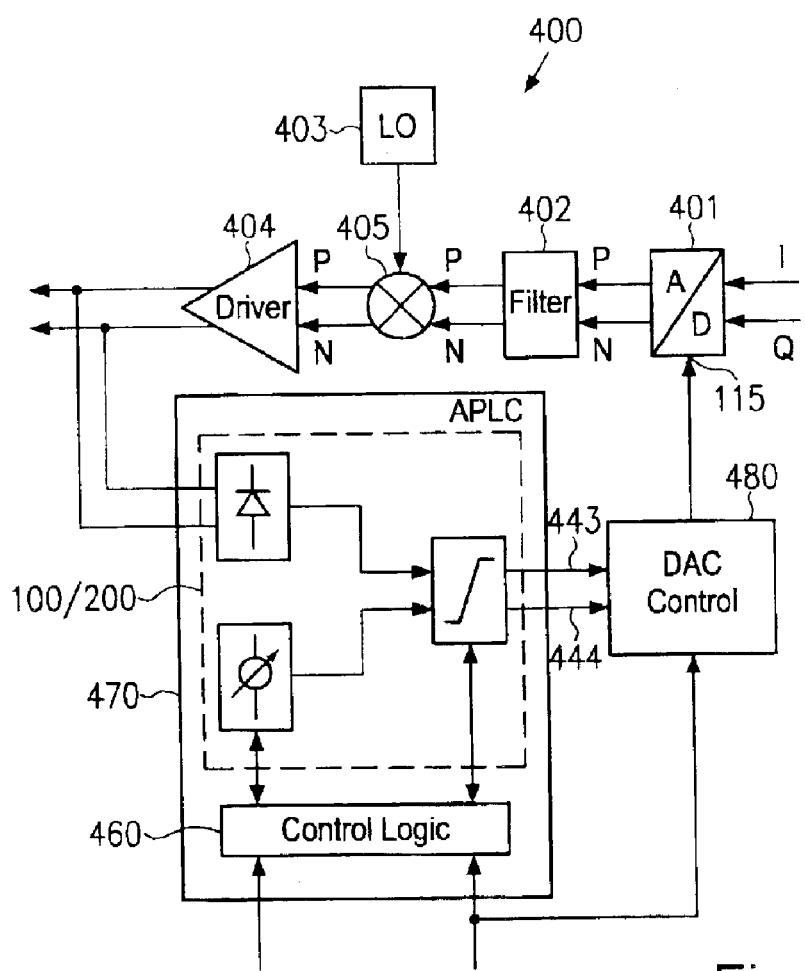
FIG. 4 is a block diagram schematically depicting a transmitter section of a transceiver device including an automatic power level control loop according to one illustrative embodiment.

FIG. 4 shows a block diagram schematically depicting one particular embodiment of a transmitter circuit 400 having an automatic power level control. The transmitter circuit 400 comprises a digital to analog converter (DAC) 401 adapted to receive an in-phase (I) base band signal and a quadrature (Q) base band signal in digital form. The DAC 401 is further configured to output a differential analog signal indicated by P and N. A filter 402 is provided next in the signal path and its output is connected to a mixer 404 that also is connected to receive a signal from a local oscillator 403. The mixer output is connected to a radio frequency output driver 404, the output of which is connected to an adaptation circuit (not shown) and to an APLC circuit 470. The APLC circuit 470 comprises and RF signal analyzing circuit, such as the circuits 100 or 200 described with reference to FIGS. 1 and 2. Moreover, a control logic 460 is provided and is configured to control the operation of the RF signal level analyzing circuit 100/200. Moreover, the control logic 460 may receive control data specifying a target output signal level or range of the output driver 404. The APLC circuit 470 is further connected to a DAC control logic 480, which in turn is connected to the DAC 401 to provide a reference or control voltage to the DAC 401 so as to shift the analog signal thereby adjusting an RF signal output level. In the embodiment illustrated in FIG. 4, the APLC circuit 470 provides two digital control signals via control lines 443 and 444 to indicate an RF signal level that is too high, or too low, or that is within a specified range. As previously explained with reference to FIG. 2, the control logic 460 may control the magnitude of the specified range by selecting the magnitude of voltage drop and the absolute position of the target RF signal level by selecting a certain stage of the voltage divider.

In operation, the transmitter circuit 400 may be used in an operational mode, wherein the digital information supplied to the DAC 401 is transmitted in specified packets, that is a specified transmit frame length is defined for each transmit event. For example, upon initializing the transmit circuit 400 the DAC control logic 480 may set the reference voltage supplied to the DAC 401 to a lowest level so as to obtain a minimum RF output level at the output driver 404. After the initialization of the APLC circuit 470, the RF signal level analyzing circuit 100/200 receives the RF output signal and establishes corresponding digital control signals at the control lines 443, 444. Depending on the signal level indicated by the control lines 443, 444 the DAC control logic 480 increases or maintains the reference voltage supplied to the DAC 401. In one particular embodiment, the measurement time for establishing the two digital control signals on the lines 443, 444 is selected to be less than a minimum transmit frame length so that a corresponding RF signal level may be evaluated within one transmit cycle. The DAC control logic 480 may then increase the reference voltage by one predefined step prior to the next transmit cycle, when the control lines 443, 444 indicated a "power too low" state.

Figure 5:
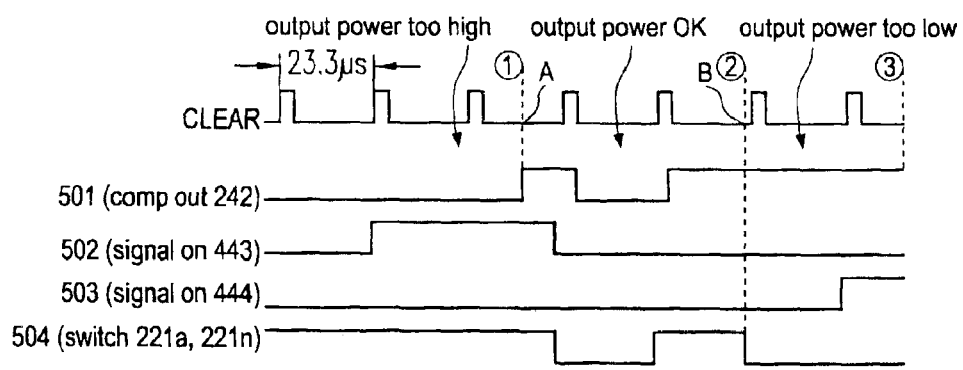
FIG. 5 schematically shows a timing diagram illustrating the operation of the transmitter section as shown in FIG. 4.

FIG. 5 is a timing diagram during operation of the transmit circuit 400, when for example the signal level analyzing circuit 200 described in FIG. 2 is used in the APLC circuit 470. It is further assumed that a minimum transmit frame length is approximately 50 microseconds and a time interval for a single measurement cycle of the signal level analyzing circuit 200 is selected to 23.3 microseconds, that is the switches 234 and 254 are closed every 23.3 microseconds for a short time interval, for example for two microseconds, to reset the first and second envelope detectors 230, 250. The signal "clear" represents the clock signal supplied to the switches 234, 254 to periodically reset the first and second envelope detectors 230, 250. The signal 501 represents the signal at the output 242 of the comparator circuit 240. The signal 502 represents the control signal on line 443 which may also be referred to as "power too high" signal. The signal 503 represents the control signal on line 444 and may also be referred to as "power too low" signal. Finally, the signal 504 represents a signal for enabling the switches 221a and 221n, respectively, and may be considered as a signal indicating whether the RF signal level is compared with the upper limit (switch 221a is enabled) or the lower limit (switch 221n is enabled). In FIG. 5, three different situations 1–3 are depicted. It is assumed that in phase 1 the RF level analyzing circuit is in the high power measuring mode, that is the switch 221a is enabled, the switch 221n is disabled, so that the RF signal level is compared to the upper limit. Then, the signal 501 (comparator output 242) is low and upon completion of the first measurement cycle, i.e. prior to the second clear signal, the comparator result is sampled and signal 502 (power too high) is set to logic high. At that time point A (phase 2) the RF power signal decreases and is lower than the upper limit and therefore the signal 501 changes to logic high. Thus, at the end of the corresponding measurement cycle the signal 502 (power too high) is set to logic low and the signal 504 is set to logic low, since now a measurement of the lower limit is necessary to unambiguously determine a state of the RF signal level. That is, switch 221a is disabled and switch 221n is enabled and the RF signal level is compared to the lower limit. During phase 2 it is assumed that the RF signal level is within the range defined by the upper and lower limit so that at the end of the corresponding measurement cycle the signal 504 is again set to logic high to initiate a comparison with the upper limit. Since the RF signal level is still within the specified range, the signal 501 (comparator output 242) changes to logic high. At time point B it is assumed that the RF signal level decreases and is below the lower limit. Thus, the signal 501 remains at logic high and requires the signal 504 to be logic low to initiate a comparison with the lower limit. The signal 501 then still remains at logic high. Thus at the end of the corresponding measurement cycle the signal 503 (power too low) is set to logic high. Thus, within two measurement cycles, the DAC control logic 480 receives an unambiguous assessment of the RF signal level and may correspondingly adjust the reference voltage supplied to the DAC 401.

It should be noted that the RF signal level analyzing circuit 100 or 200 may also be provided at the receiver side of a transceiver device so as to supply a control signal indicative of the received RF signal level so that a appropriate control operation may be carried out on the basis of this control signal.

Further modifications and variations of the present invention will be apparent to those skilled in the art in view of this description. Accordingly, the description is to be construed as illustrative only and is for the purpose of teaching those skilled in the art, the general manner of carrying out the present invention.

What is claimed is:

1. An integrated radio frequency signal level analyzing circuit comprising:
    a reference voltage source configured to provide at least one reference voltage;
    a DC/AC converter configured to receive said at least one reference voltage and to produce an AC reference voltage corresponding to said at least one reference voltage;
    an envelope detector configured to receive said AC reference voltage and a radio frequency signal to be detected, and to generate a reference envelope signal and a radio frequency envelope signal; and
    a comparator circuit configured to receive said radio frequency envelope signal and said reference envelope signal and to produce a comparator output signal indicative of a comparison result of the comparator circuit.

2. The analyzing circuit of claim 1, wherein said reference voltage source comprises a plurality of resistors connected in series.

3. The analyzing circuit of claim 1, wherein said reference voltage source is configured to provide at least two reference voltages determining an upper limit and a lower limit for a specified voltage level.

4. The analyzing circuit of claim 3, further comprising a control circuit configured to select said predefined voltage level.

5. The analyzing circuit of claim 3, further comprising a plurality of switches connected to said reference voltage source and arranged to allow to selectively supply said at least one reference voltage to said DC/AC converter.

6. The analyzing circuit of claim 1, wherein said reference voltage source is configured to provide a plurality of reference voltages and wherein said DC/AC converter is configured to convert each of said plurality of reference voltages within the same signal path.

7. The analyzing circuit of claim 1, wherein said envelope detector comprises an AC coupled source follower.

8. The analyzing circuit of claim 7, wherein said envelope detector further comprises an integration capacitor.

9. The analyzing circuit of claim 1, wherein said envelope detector comprises a first detector section and a second detector section, the first detector section and the second detector section being substantially identical, wherein the first detector section is connected to receive said at least one AC reference voltage and the second detector section is arranged to receive said radio frequency signal.

10. The analyzing circuit of claim 1, wherein said envelope detector further comprises a switch element configured to reset an output of said envelope detector.

11. The analyzing circuit of claim 1, wherein said comparator circuit comprises an offset compensated comparator.

12. An integrated radio frequency signal level analyzing circuit comprising:
    a reference voltage source configured to provide a first reference voltage and a second reference voltage;
    a single channel DC/AC converter configured to selectively receive said first and said second reference voltage and to output an AC reference voltage indicative of a DC voltage input to said DC/AC converter; and
    a comparator circuit configured to receive said radio frequency signal and said AC reference voltage, and to output a control signal indicative of a comparison result between said radio frequency signal and said AC reference voltage.

13. The analyzing circuit of claim 12, wherein said reference voltage source comprises a plurality of resistors connected in series.

14. The analyzing circuit of claim 12, wherein said first and second reference voltages determine an upper limit and a lower limit, respectively, of a specified voltage level.

15. The analyzing circuit of claim 14, further comprising a control circuit configured to select said predefined voltage level.

16. The analyzing circuit of claim 12, further comprising a plurality of switches connected to said reference voltage source and arranged to allow to selectively supply said first and second reference voltages to said DC/AC converter.

17. The analyzing circuit of claim 12, wherein said reference voltage source is configured to provide a plurality of reference voltages and wherein said DC/AC converter is configured to convert each of said plurality of reference voltages within the same signal path.

18. The analyzing circuit of claim 12, wherein said comparator circuit comprises an envelope detector including an AC coupled source follower.

19. The analyzing circuit of claim 18, wherein said envelope detector further comprises an integration capacitor.

20. The analyzing circuit of claim 18, wherein said envelope detector further comprises a first detector section and a second detector section, the first detector section and the second detector section being substantially identical, wherein the first detector section is connected to receive said AC reference voltage and the second detector section is arranged to receive said radio frequency signal.

21. The analyzing circuit of claim 18, wherein said envelope detector further comprises a switch element configured to reset an output of said envelope detector.

22. The analyzing circuit of claim 12, wherein said comparator circuit comprises an offset compensated comparator.

23. A transceiver device comprising:
    a transmit circuit including an RF output stage;
    a control unit configured to adjust an output power level of said output stage;
    an RF signal level analyzing circuit including
    a reference voltage source configured to provide at least one reference voltage;

a DC/AC converter configured to receive said at least one reference voltage and to produce an AC reference voltage corresponding to said at least one reference voltage;

an envelope detector configured to receive said AC reference voltage and a radio frequency signal output by said RF output stage, and to generate a reference envelope signal and a radio frequency envelope signal; and a comparator circuit configured to receive said radio frequency envelope signal and said reference envelope signal and to produce a comparator output signal indicative of a comparison result of the comparator circuit, wherein said control unit adjusts said output power level on the basis of said output signal.

24. A transceiver device comprising:

a transmit circuit including an RF output stage;

a control unit configured to adjust an output power level of said output stage;

an RF signal level analyzing circuit including:

a reference voltage source configured to provide a first reference voltage and a second reference voltage;

a single channel DC/AC converter configured to selectively receive said first and said second reference voltage and to output an AC reference voltage indicative of a DC voltage input to said DC/AC converter; and a comparator circuit configured to receive a radio frequency signal output by said RF output stage and said AC reference voltage, and to output a control signal indicative of a comparison result between said radio frequency signal and said AC reference voltage, wherein said control unit adjusts said output power level on the basis of said control signal.

25. A method of detecting a radio frequency signal level, the method comprising:

providing a first reference voltage and a second reference voltage;

selectively converting the first and the second reference voltage into an AC reference voltage via the same signal processing path; and comparing said radio frequency signal with said AC reference voltage.

26. A method of detecting a radio frequency signal level, the method comprising:

providing at least one DC reference voltage;

converting said at least one DC reference voltage into an AC reference voltage;

measuring an envelope of said radio frequency signal and of said AC reference voltage; and comparing said envelope of the radio frequency signal with the envelope of said AC reference voltage to produce a control output signal indicative of a result of the comparison.

* * * * *